(12) United States Patent
Yu et al.

(10) Patent No.: US 11,756,904 B2
(45) Date of Patent: Sep. 12, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Yuanhao Yu, Kaohsiung (TW); Cheng-Lin Ho, Kaohsiung (TW); Yu-Lin Shih, Kaohsiung (TW); Shih-Chun Li, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 144 days.

(21) Appl. No.: 16/895,989

(22) Filed: Jun. 8, 2020

(65) Prior Publication Data
US 2021/0384148 A1    Dec. 9, 2021

(51) Int. Cl.
*H01L 23/66* (2006.01)
*H01Q 1/22* (2006.01)

(52) U.S. Cl.
CPC .......... *H01L 23/66* (2013.01); *H01Q 1/2283* (2013.01); *H01L 2223/6616* (2013.01); *H01L 2223/6677* (2013.01)

(58) Field of Classification Search
None
See application file for complete search history.

(56) References Cited

U.S. PATENT DOCUMENTS

| 10,096,558 | B1* | 10/2018 | Chiang | H01L 23/66 |
| 10,461,041 | B2* | 10/2019 | Chiu | H01L 23/3128 |
| 10,573,608 | B2* | 2/2020 | Dogiamis | H01L 23/552 |
| 2013/0015563 | A1* | 1/2013 | Lee | H01Q 1/2283 257/659 |
| 2016/0020165 | A1* | 1/2016 | Kamgaing | H01L 23/49894 257/532 |
| 2017/0126047 | A1* | 5/2017 | Chen | H01L 23/66 |
| 2018/0332151 | A1* | 11/2018 | Kamgaing | H01Q 1/243 |
| 2019/0103652 | A1* | 4/2019 | Chuang | H01Q 1/526 |
| 2019/0115643 | A1* | 4/2019 | Khan | H01Q 9/42 |
| 2019/0189572 | A1* | 6/2019 | Chiang | H01L 23/5226 |
| 2019/0305428 | A1* | 10/2019 | Hwang | H01Q 19/005 |
| 2019/0333881 | A1* | 10/2019 | Chen | H01Q 1/2283 |
| 2020/0161744 | A1* | 5/2020 | Baks | H01Q 21/065 |
| 2020/0279829 | A1* | 9/2020 | Elsherbini | H01L 25/065 |

FOREIGN PATENT DOCUMENTS

CN        105591188 B    10/2018

* cited by examiner

*Primary Examiner* — Nishath Yasmeen
(74) *Attorney, Agent, or Firm* — FOLEY & LARDNER LLP (57) ABSTRACT

A semiconductor device package includes a substrate, a reflector, a radiator and a first director. The reflector is disposed on a surface of the substrate. The radiator is disposed over the reflector. The first director is disposed over the radiator. The reflector, the radiator and the first director have different elevations with respect to the surface of the substrate. The radiator and the first director define an antenna.

20 Claims, 11 Drawing Sheets

FIG. 5L

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an antenna structure and a method of manufacturing the same.

2. Description of the Related Art

Wireless communication devices, such as cell phones, typically include antennas for transmitting and receiving radio frequency (RF) signals. A wireless communication device may include an antenna module and a communication module disposed on a substrate. In general, a direction of the electromagnetic radiation emitted from the antenna module is parallel to a surface of the substrate, which would limit the applicability of the wireless communication device.

SUMMARY

In accordance with some embodiments of the present disclosure, a semiconductor device package includes a substrate, a reflector, a radiator and a first director. The reflector is disposed on a surface of the substrate. The radiator is disposed over the reflector. The first director is disposed over the radiator. The reflector, the radiator and the first director have different elevations with respect to the surface of the substrate. The radiator and the first director define an antenna.

In accordance with some embodiments of the present disclosure, an antenna module includes a substrate, a reflector, a radiator and a first director. The reflector is disposed on a surface of the substrate. The radiator is disposed over the reflector. The first director is disposed over the radiator. The reflector, the radiator and the first director define a straight line. The straight line and the surface of the substrate define an angle greater than 0 degree.

In accordance with some embodiments of the present disclosure, a method of manufacturing a semiconductor device package includes (a) providing a reflector; (b) forming a first package body to cover the reflector; (c) disposing a radiator on the first package body; (d) forming a second package body to cover the radiator; and (e) disposing a first director on the second package body.

Common reference numerals are used throughout the drawings and the detailed description to indicate the same or similar components. The present disclosure will be readily understood from the following detailed description taken in conjunction with the accompanying drawings.

DETAILED DESCRIPTION

Figure 1:
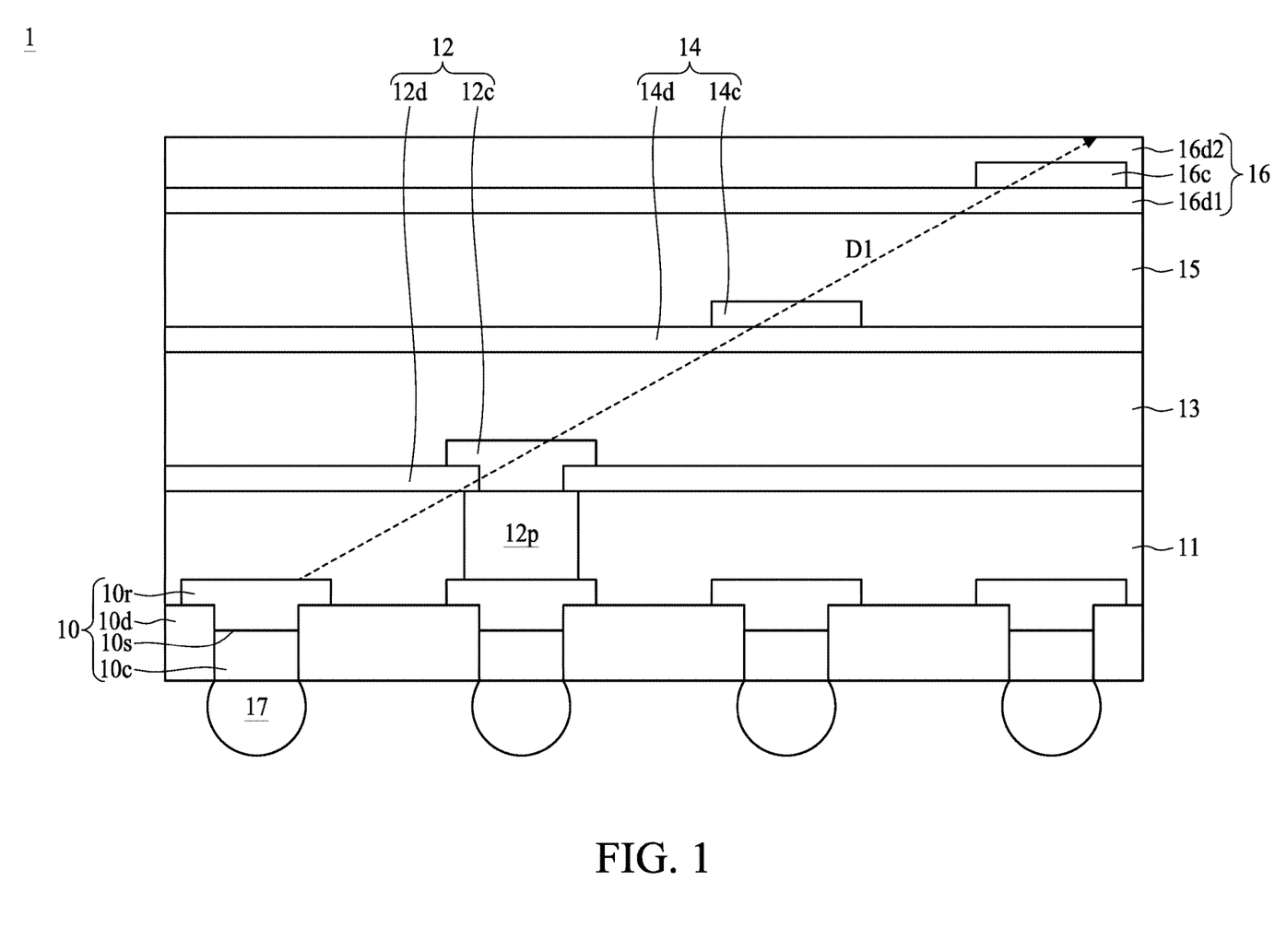
FIG. 1 illustrates a cross-sectional view of a semiconductor device package, in accordance with some embodiments of the present disclosure.

FIG. 1 illustrates a cross-sectional view of a semiconductor device package 1, in accordance with some embodiments of the present disclosure. The semiconductor device package 1 includes circuit layers 10, 12, 14, 16, package bodies 11, 13, 15 and electrical contacts 17. In some embodiments, the semiconductor device package 1 may be or include an antenna module.

The circuit layer 10 (or building-up circuit) may include one or more conductive layers (e.g., redistribution layers, RDLs, conductive vias, conductive pads or the like) 10$c$, 10$r$ and one or more dielectric layers 10$d$. A portion of the conductive layer (e.g., conductive via) 10$c$ is covered or encapsulated by the dielectric layer 10$d$ while another portion of the conductive layer 10$c$ is exposed from the dielectric layer 10$d$ to provide electrical connections. For example, a lateral surface of the conductive layer 10$c$ is covered by the dielectric layer 10$d$. A bottom surface of the conductive layer 10$c$ is exposed from the dielectric layer 10$d$ and electrically connected to the electrical contacts 17 (e.g., solder balls). One or more conductive layers (e.g., conductive pads) 10$r$ are disposed on the dielectric layer 10$d$. The conductive layers 10$r$ may extend within the dielectric layer 10$d$ and electrically connected to the conductive layer 10$c$. In some embodiments, a seed layer 10$s$ is disposed between the conductive layer 10$c$ and the conductive layer 10$r$.

A conductive structure (e.g., a conductive pillar, a conductive post, a conductive column or a conductive pin) 12$p$ is disposed on the circuit layer 10. The conductive structure 12$p$ is electrically connected to at least one of the conductive layers 10$r$. The conductive structure 12$p$ electrically connects the circuit layer 12 with the circuit layer 10.

In some embodiments, the dielectric layer 10$d$ may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets. In some embodiments, there may be any number of conductive layers or dielectric layers depending on design specifications. In some embodiments, the conductive layers 10$c$, 10$r$ and the conductive structure 12$p$ may be formed of or include gold (Au), silver (Ag), copper (Cu), platinum (Pt), palladium (Pd), other metal(s) or alloy(s), or a combination of two or more thereof.

The package body 11 is disposed on the circuit layer 10. The package body 11 covers a portion of the conductive layer 10$r$ and a portion of the conductive structure 12$p$. In some embodiments, a top surface of the conductive structure 12$p$ is exposed from the package body 11 for electrical connections. In some embodiments, the package body 11 includes an epoxy resin including fillers, a molding compound (e.g., an epoxy molding compound or other molding compound), a polyimide, a phenolic compound or material, a material including a silicone dispersed therein, or a combination thereof. In some embodiments, the package body 11 includes a molding compound with fillers or pre-preg with fibers.

The circuit layer 12 (or building-up circuit) disposed on the package body 11. The circuit layer 12 may include a conductive layer (e.g., conductive pad) 12c and a dielectric layer 12d. The conductive layer 12c is disposed on the dielectric layer 12d. The conductive layer 12c penetrates the dielectric layer 12d and electrically connects to the conductive structure 12p.

In some embodiments, the dielectric layer 12d may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, there may be any number of conductive layers or dielectric layers depending on design specifications. In some embodiments, the conductive layer 12c may be formed of or include Au, Ag, Cu, Pt, Pd, other metal(s) or alloy(s), or a combination of two or more thereof.

The package body 13 is disposed on the circuit layer 12. The package body 13 covers a portion of the conductive layer 12c exposed from the dielectric layer 12d. In some embodiments, the package body 13 includes an epoxy resin including fillers, a molding compound (e.g., an epoxy molding compound or other molding compound), a polyimide, a phenolic compound or material, a material including a silicone dispersed therein, or a combination thereof. In some embodiments, the package body 13 includes a molding compound with fillers or pre-preg with fibers.

The circuit layer 14 (or building-up circuit) is disposed on the package body 13. The circuit layer 14 may include a conductive layer (e.g., conductive pad) 14c and a dielectric layer 14d. The conductive layer 14c is disposed on the dielectric layer 14d. In some embodiments, the dielectric layer 14d may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, there may be any number of conductive layers or dielectric layers depending on design specifications. In some embodiments, the conductive layer 14c may be formed of or include Au, Ag, Cu, Pt, Pd, other metal(s) or alloy(s), or a combination of two or more thereof.

The package body 15 is disposed on the circuit layer 14. The package body 15 covers the conductive layer 14c. In some embodiments, the package body 15 includes an epoxy resin including fillers, a molding compound (e.g., an epoxy molding compound or other molding compound), a polyimide, a phenolic compound or material, a material including a silicone dispersed therein, or a combination thereof. In some embodiments, the package body 15 includes a molding compound with fillers or pre-preg with fibers.

The circuit layer 16 (or building-up circuit) is disposed on the package body 15. The circuit layer 16 may include a conductive layer (e.g., conductive pad) 16c and a dielectric layer 16d1. The conductive layer 16c is disposed on the dielectric layer 16d1. In some embodiments, a dielectric layer (or a projection layer) 16d2 is disposed on the dielectric layer 16d1 and covers the conductive layer 16c. In some embodiments, the dielectric layers 16d1, 16d2 may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, there may be any number of conductive layers or dielectric layers depending on design specifications. In some embodiments, the conductive layer 16c may be formed of or include Au, Ag, Cu, Pt, Pd, other metal(s) or alloy(s), or a combination of two or more thereof.

In some embodiments, the conductive layer 10r, the conductive layer 12c, the conductive layer 14c and the conductive layer 16c may define an antenna or an antenna pattern (e.g., Yagi antenna). For example, the conductive layer 10r may define or function as a reflector of the antenna. For example, the conductive layer 12c may define or function as a radiator (or driver) of the antenna. For example, the conductive layer 14c may define or function as a director of the antenna. For example, the conductive layer 16c may define or function as a reflector of the antenna. In some embodiments, the circuit layer 16 may be omitted, and the antenna may have only one director.

In some embodiments, the reflector, the radiator and the director(s) of an antenna may be disposed on the same level. For example, the reflector, the radiator and the director(s) of the antenna may be disposed on the same circuit layer. For example, the reflector, the radiator and the director(s) of the antenna may have the same elevation. In such embodiments, the electromagnetic waveform is radiated (or transmitted) in a direction substantially parallel to the arrangement of the reflector, the radiator and the director(s) of the antenna (e.g., parallel to a surface of the circuit layer on which the reflector, the radiator and the director(s) of the antenna are disposed). In other words, the electromagnetic waveform cannot be radiated or transmitted in other directions, which would reduce the flexibility for designing an antenna module. In addition, the applicability of the antenna module are limited due to the limitation of the transmission direction of the antenna.

In accordance with the embodiments as shown in FIG. 1, the reflector (e.g., the conductive layer 10r), the radiator (e.g., the conductive layer 12c) and the directors (e.g., the conductive layers 16c) of the antenna are disposed on different circuit layers. For example, the reflector, the radiator and the directors of the antenna have different elevations with respect to a top surface of the circuit layer 10. For example, a straight line (e.g., the dotted line D1) passing through the reflector, the radiator and the directors of the antenna and the top surface of the circuit layer may define an angle larger than 0 degree. In such embodiments, the electromagnetic waveform can be radiated (or transmitted) in a direction substantially along the dotted line D1 as shown in FIG. 1. For example, the radiation direction of the antenna and the top surface of the circuit layer 10 may define an angle larger than 0 degree.

In some embodiments, the radiation direction of the antenna (or the angle defined by the radiation direction of the antenna and the top surface of the circuit layer 10) can be determined based on a thickness of each of the package bodies 11, 13 and 15. For example, if the thickness of each of the package bodies 11, 13 and 15 increases, the angle defined by the radiation direction of the antenna and the top surface of the circuit layer 10 increases as well. In some embodiments, the radiation direction of the antenna can be determined based on a horizontal distance between the reflector, the radiator and the directors of the antenna. For example, if the horizontal distance between the reflector, the radiator and the directors of the antenna increases, the angle defined by the radiation direction of the antenna and the top surface of the circuit layer 10 decreases. Therefore, it is more flexible to design an antenna module with the desired radiation direction.

Figure 2:
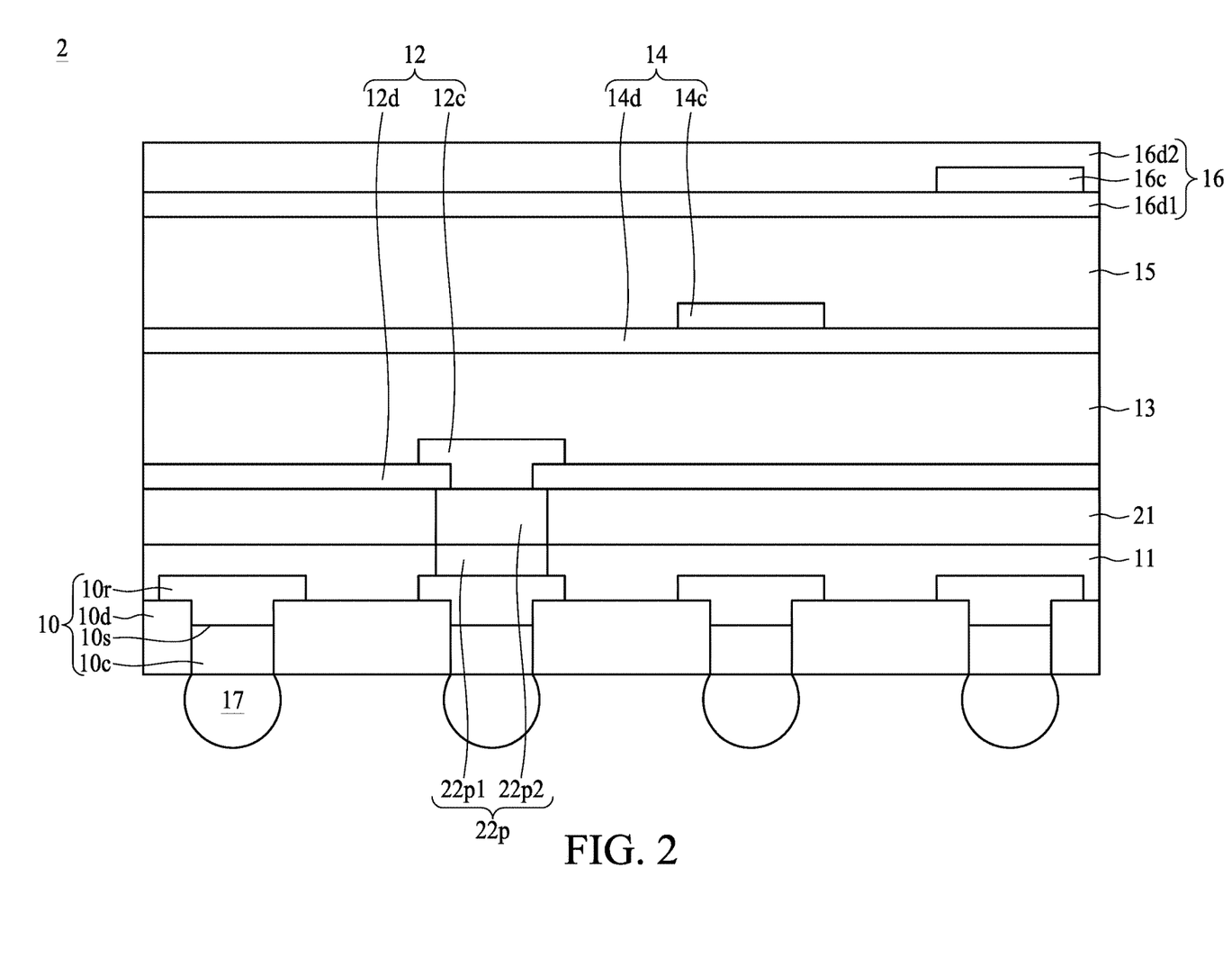
FIG. 2 illustrates a cross-sectional view of a semiconductor device package, in accordance with some embodiments of the present disclosure.

FIG. 2 illustrates a cross-sectional view of a semiconductor device package 2, in accordance with some embodiments of the present disclosure. The semiconductor device package 2 is similar to the semiconductor device package 1 as shown in FIG. 1, and some of the differences therebetween are described below.

The semiconductor device package 2 further includes a package body 21. The package body 21 is disposed between the package body 11 and the circuit layer 12. In some embodiments, the package body 21 and the package body 11 may be formed in different steps during the manufacturing processes, and thus there is an interface between the package body 21 and the package body 11. In some embodiments, the package body 21 includes an epoxy resin including fillers, a molding compound (e.g., an epoxy molding compound or other molding compound), a polyimide, a phenolic compound or material, a material including a silicone dispersed therein, or a combination thereof. In some embodiments, the package body 21 includes a molding compound with fillers or pre-preg with fibers.

A conductive structure (e.g., a conductive pillar, a conductive post, a conductive column or a conductive pin) $22p$ penetrates the package body 21 and the package body 11 to electrically connect the circuit layer 12 with the circuit layer 10. The conductive structure $22p$ includes a portion $22p1$ and a portion $22p2$ disposed over the portion $22p1$. The portion $22p1$ is disposed within the package body 11. For example, the portion $22p1$ is surrounded by and in contact with the package body 11. The portion $22p2$ is disposed within the package body 21. For example, the portion $22p2$ is surrounded by and in contact with the package body 21. In some embodiments, the portion $22p1$ and the portion $22p2$ may be formed in different steps during the manufacturing processes, and thus there is an interface between the portion $22p1$ and the portion $22p2$. In some embodiments, the interface between the portion $22p1$ and the portion $22p2$ is substantially coplanar with the interface between the package body 21 and the package body 11. In some embodiments, a width (or diameter) of the portion $22p1$ may be equal to, less than or greater than a width (or diameter) of the portion $22p2$ depending on different design requirements.

Due to the process limitation (e.g., plating), it is difficult to form a tall pillar to meet the requirements for designing an antenna, which may adversely affect the performance of the antenna. In accordance with the embodiments as shown in FIG. 2, the conductive structure $22p$ includes two portions $22p1$ and $22p2$, which are formed in different steps. Hence, it is easier and more flexible to design the conductive structure $22p$ with the sufficient height to meet the requirements for designing an antenna.

Figure 3:
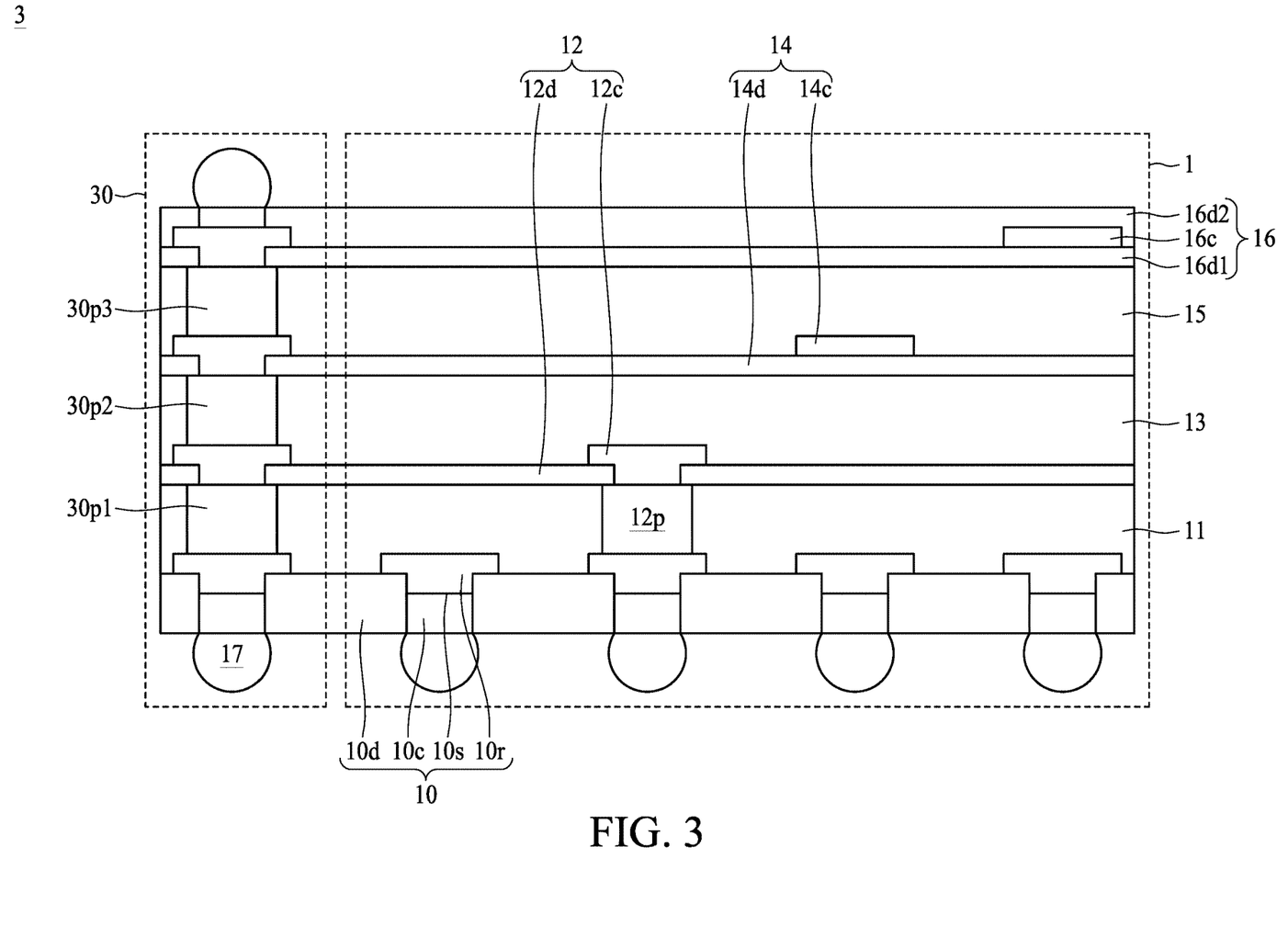
FIG. 3 illustrates a cross-sectional view of a semiconductor device package, in accordance with some embodiments of the present disclosure.

FIG. 3 illustrates a cross-sectional view of a semiconductor device package 3, in accordance with some embodiments of the present disclosure. In some embodiments, the semiconductor device package 3 may include the semiconductor device package 1 as shown in FIG. 1 and an interconnection structure 30.

In some embodiments, the interconnection structure 30 penetrate the package bodies 11, 13 and 15 to provide electrical connections between an upper portion and a lower portion of the semiconductor device package 3. For example, the interconnection structure 30 may electrically connect the circuit layer 16 with the circuit layers 10, 12 and 14. In some embodiments, the interconnection structure 30 may include one or more conductive pillars $30p1$, $30p2$, $30p3$. As shown in FIG. 3, the conductive pillar $30p1$ may penetrate the package body 11 and electrically connect the circuit layer 10 with the circuit layer 12. The conductive pillar $30p2$ may penetrate the package body 13 and electrically connect the circuit layer 12 with the circuit layer 14. The conductive pillar $30p3$ may penetrate the package body 15 and electrically connect the circuit layer 14 with the circuit layer 16.

Figure 4A:
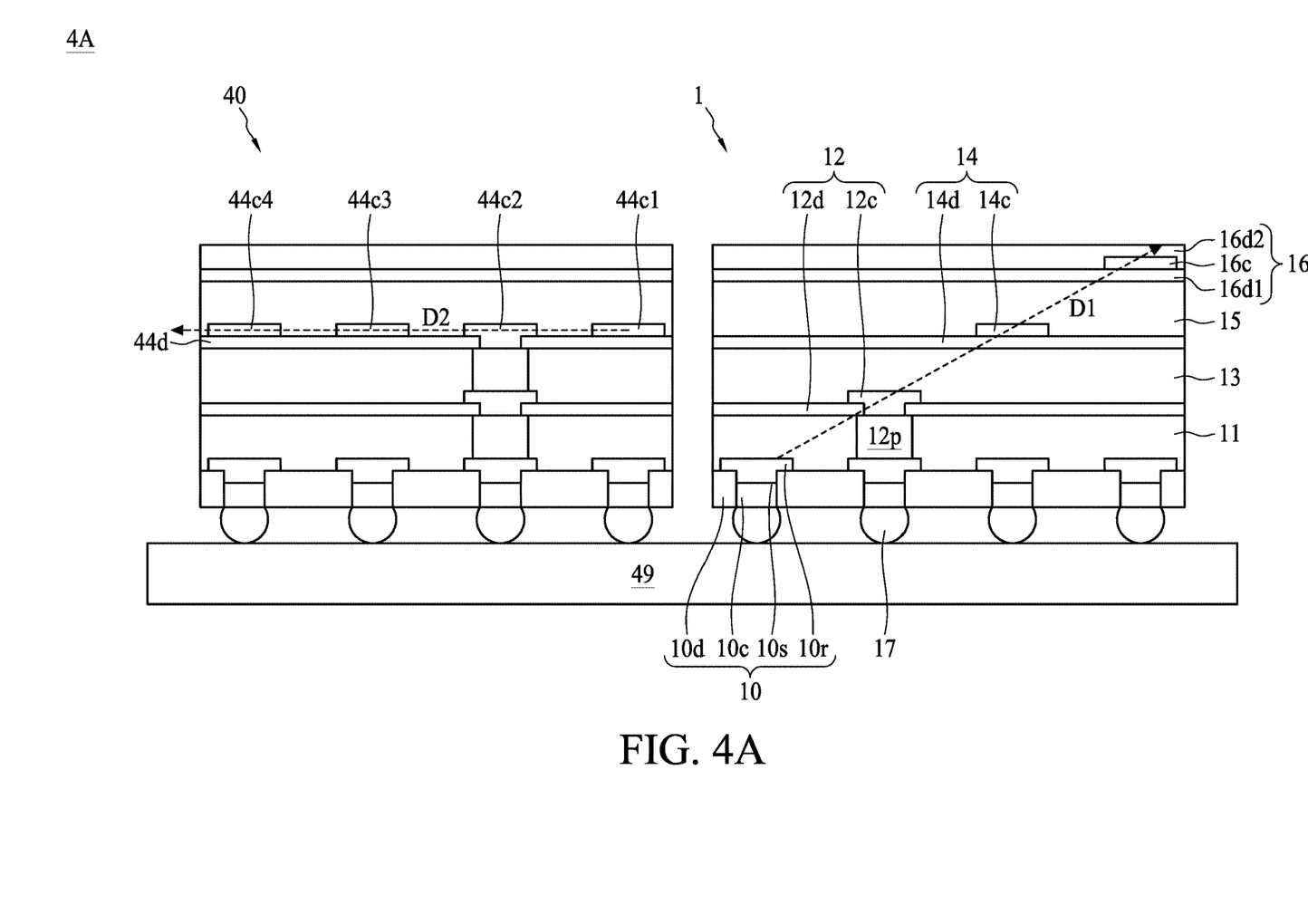
FIG. 4A illustrates a cross-sectional view of a semiconductor device, in accordance with some embodiments of the present disclosure.

FIG. 4A illustrates a cross-sectional view of a semiconductor device 4A, in accordance with some embodiments of the present disclosure. In some embodiments, the semiconductor device 4A may include a substrate 49, the semiconductor device package 1 as shown in FIG. 1 and a semiconductor device package 40.

The substrate 49 may be, for example, a printed circuit board, such as a paper-based copper foil laminate, a composite copper foil laminate, or a polymer-impregnated glass-fiber-based copper foil laminate. The substrate 49 may include an interconnection structure, such as a redistribution layer (RDL) or a grounding element.

The semiconductor device package 1 and the semiconductor device package 40 are disposed on the substrate 49. The semiconductor device package 1 and the semiconductor device package 40 may be electrically connected to each other through the substrate 49. The semiconductor device package 40 is similar to the semiconductor device package 1, and some of the differences therebetween are described below.

The semiconductor device package 40 includes conductive pads $44c1$, $44c2$, $44c3$ and $44c4$. The conductive pads $44c1$, $44c2$, $44c3$ and $44c4$ are disposed on a same dielectric layer $44d$. In some embodiments, the conductive pads $44c1$, $44c2$, $44c3$ and $44c4$ may define an antenna (e.g., Yagi antenna). The conductive pad $44c1$ may function as a reflector of the antenna. The conductive pad $44c2$ may function as a radiator of the antenna. The conductive pads $44c3$ and $44c4$ may function as directors of the antenna. Since the reflector, the radiator and the directors of the antenna have a same elevation, the electromagnetic waveform of the antenna can be radiated (or transmitted) in a direction substantially along the dotted line D2 as shown in FIG. 4A.

In accordance with the embodiments as shown in FIG. 4A, the semiconductor device 4A may include two antenna modules (e.g., the semiconductor device package 1 and the semiconductor device package 40) have different radiation directions. For example, the radiation direction of the semiconductor device package 1 is along the dotted line D1 while the radiation direction of the semiconductor device package 40 is along the dotted line D2. This can increase the applicability of the semiconductor device 4A.

Figure 4B:
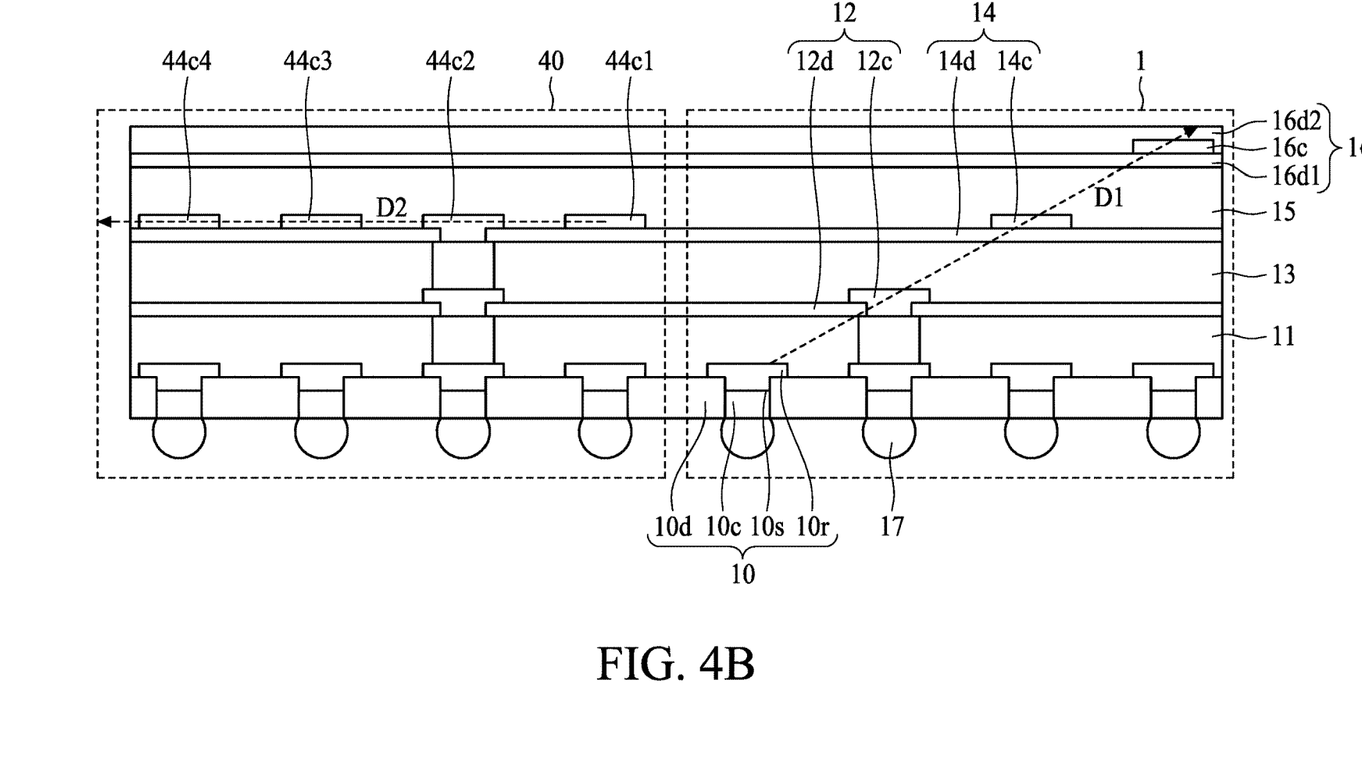
FIG. 4B illustrates a cross-sectional view of a semiconductor device, in accordance with some embodiments of the present disclosure.

In some embodiments, as shown in FIG. 4A, two antenna modules (e.g., the semiconductor device package 1 and the semiconductor device package 40) may be separated from each other and electrically connected to each other through the substrate 49. In other embodiments, as shown in FIG. 4B, two antenna modules (e.g., the semiconductor device package 1 and the semiconductor device package 40) may be integrated into a single semiconductor device 4B, which can reduce the size of the semiconductor device 4B. In addition, the adverse effects caused by parasitic capacitors, inductors and resistors of the semiconductor device 4A may be mitigated or eliminated.

FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L illustrate cross-sectional views of a semiconductor manufacturing method, in accordance with some embodiments of the present disclosure. In some embodiments, the method in FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L can be used to manufacture the semiconductor device package 1 as shown in FIG. 1.

Figure 5A:
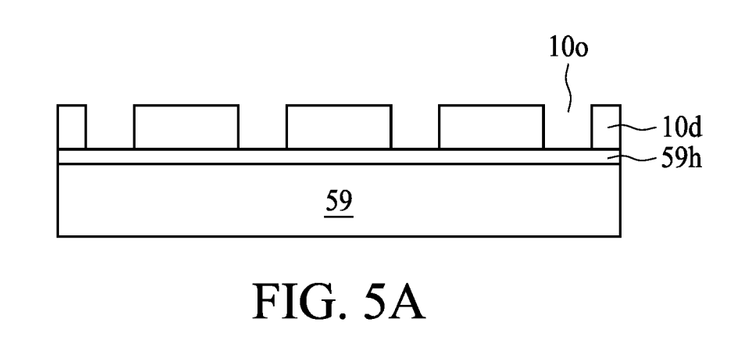
FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L illustrates a semiconductor manufacturing method in accordance with some embodiments of the present disclosure.

Referring to FIG. 5A, a carrier 59 is provided. In some embodiments, the carrier 59 may include an adhesive layer 59h (e.g., a die attach film (DAF), a tape, glue or a metal layer) disposed thereon. A patterned dielectric layer (i.e., the dielectric layer 10d) is formed on the carrier 59. The dielectric layer 10d may be connected to the carrier 59 through the adhesive layer 59h. The dielectric layer 10d includes one or more openings 10o penetrating the dielectric layer 10d to expose a portion of the adhesive layer 59h.

Figure 5B:
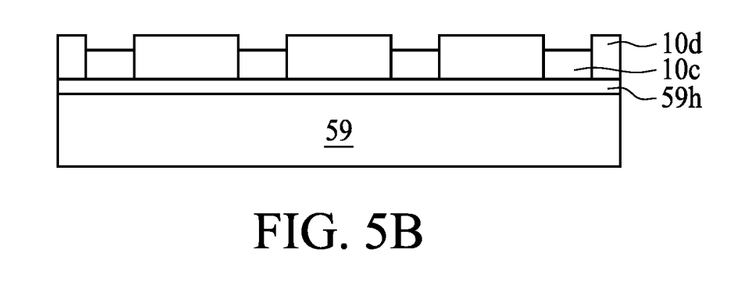

Referring to FIG. 5B, conductive materials are formed within the openings 10o to form a conductive layer 10c (e.g., conductive via). In some embodiments, the conductive layer 10c is formed by, for example, plating or any other suitable operations. In some embodiments, the conductive layer 10c is recessed from the dielectric layer 10d. For example, a top surface of the conductive layer 10c is lower than a top surface of the dielectric layer 10d.

Figure 5C:
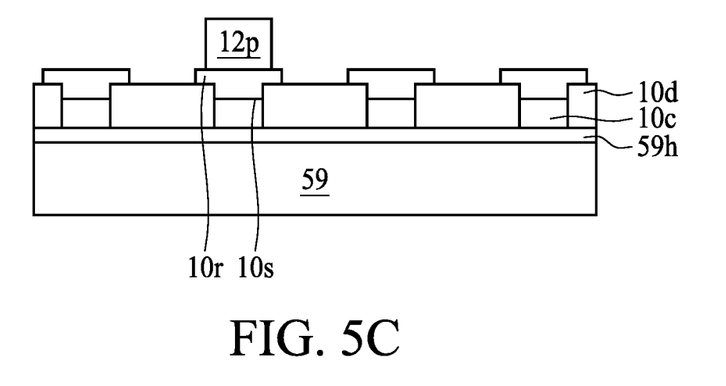

Referring to FIG. 5C, a seed layer 10s is formed a conductive layer 10r (e.g., a conductive pad) is formed on the conductive layer 10c. The conductive layer 10r is then formed on the conductive layer 10r by, for example, plating or any other suitable operations. In some embodiments, the conductive layer 10r and the seed layer 10s may be formed by the following operations: (i) forming a seed layer 10s on the dielectric layer 10d and within the recesses defined by the conductive layer 10c and the dielectric layer 10d; (ii) forming the conductive layer 10r on the dielectric layer 10d and within the recesses defined by the conductive layer 10c and the dielectric layer 10d; and (iii) removing a portion of the seed layer that is not covered by the conductive layer 10r by, for example, etching or any other suitable operations. A conductive structure 12p is then formed on the conductive layer 10r.

Figure 5D:
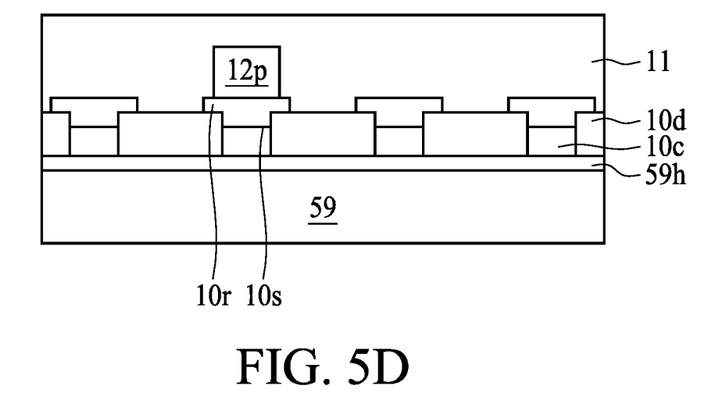
Figure 5E:
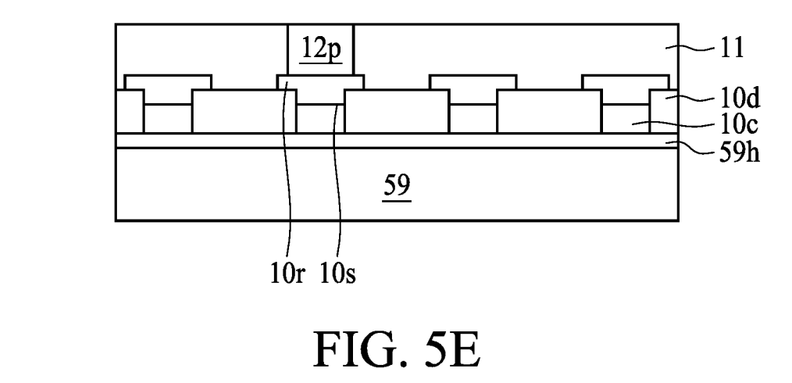

Referring to FIG. 5D, a package body 11 is formed to cover the conductive layer 10r and the conductive structure 12p. In some embodiments, the package body 11 may be formed by, for example, compression molding, transfer molding or any other suitable operations. In some embodiments, the package body 11 may be formed to fully cover the conductive structure 12p as shown in FIG. 5D. A portion of package body 11 is then removed to expose a top surface of the conductive structure 12p as shown in FIG. 5E. In some embodiments, the portion of the package body 11 may be removed by, for example, grinding or any other suitable operations.

Figure 5F:
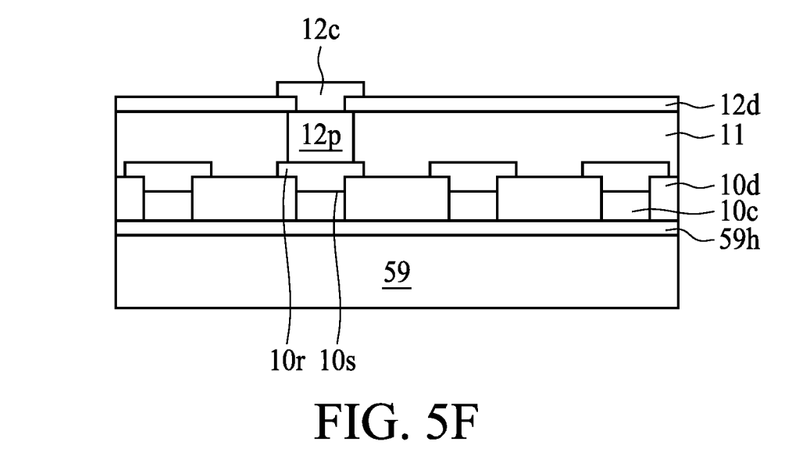

Referring to FIG. 5F, a dielectric layer 12d is formed on the package body 11. The dielectric layer 12d includes an opening penetrating the dielectric layer 12d to expose at least a portion of a top surface of the conductive structure 12p. A conductive layer 12c is then formed on the dielectric layer 12d and within the opening of the dielectric layer 12d to electrically connect to the conductive structure 12p. In some embodiments, the conductive layer 12c is formed by, for example, plating or any other suitable operations. In some embodiments, a seed layer may be formed on the top surface of the conductive structure 12p prior to the formation of the conductive layer 12c.

Figure 5G:
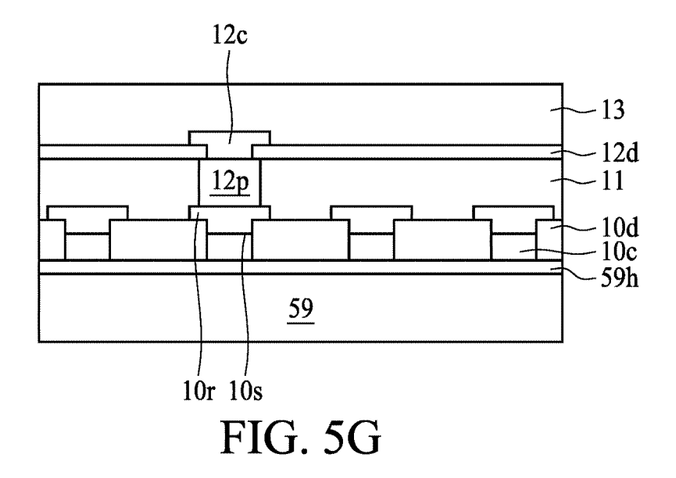

Referring to FIG. 5G, a package body 13 is formed on the dielectric layer 12d to cover the conductive layer 12c. In some embodiments, the package body 13 may be formed by, for example, compression molding, transfer molding or any other suitable operations.

Figure 5H:
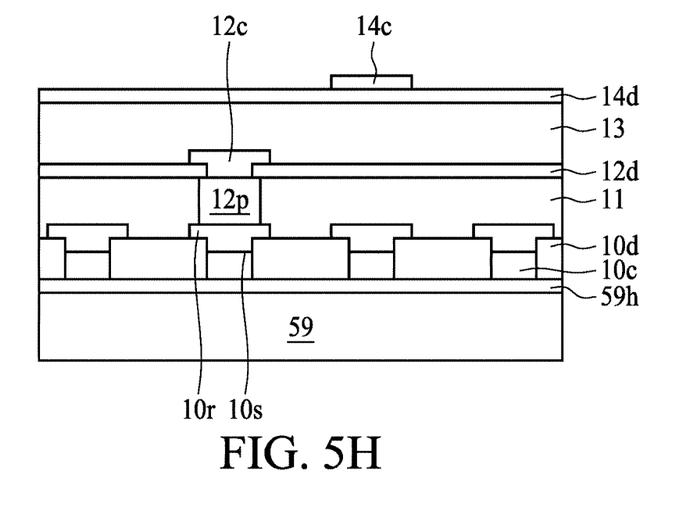

Referring to FIG. 5H, a dielectric layer 14d is formed on the package body 13. A conductive layer 14c (e.g., a conductive pad) is then formed on the dielectric layer 14d by, for example, plating or any other suitable operations.

Figure 5I:
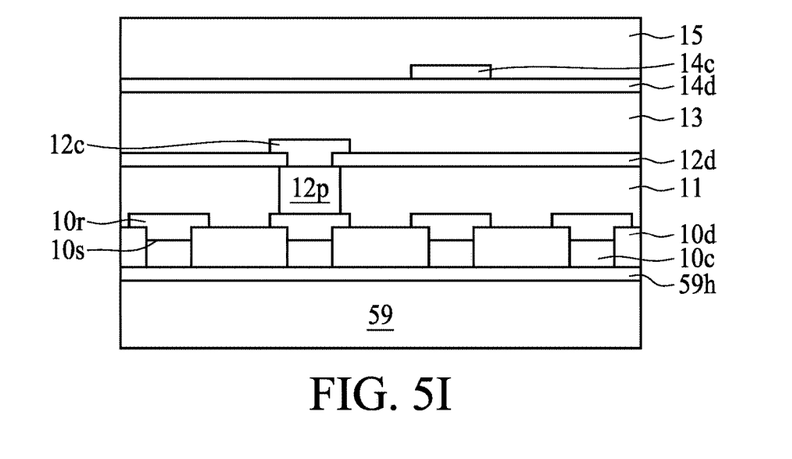

Referring to FIG. 5I, a package body 15 is formed on the dielectric layer 14d to cover the conductive layer 14c. In some embodiments, the package body 15 may be formed by, for example, compression molding, transfer molding or any other suitable operations.

Figure 5J:
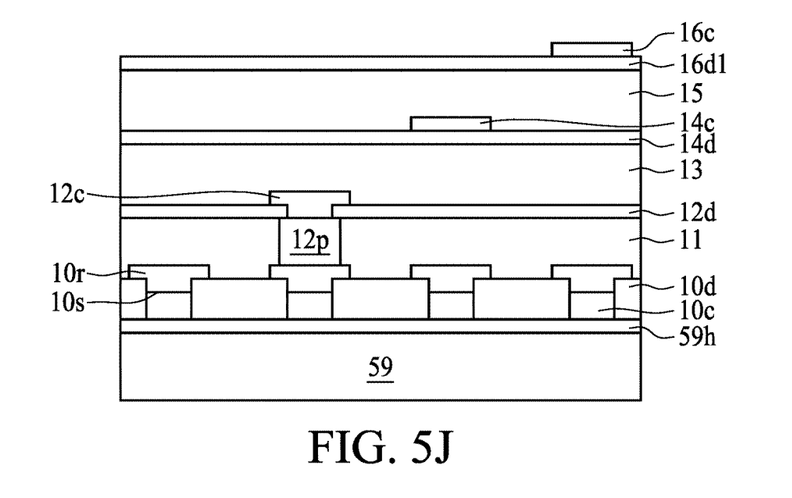

Referring to FIG. 5J, a dielectric layer 16da is formed on the package body 15. A conductive layer 16c (e.g., a conductive pad) is then formed on the dielectric layer 16d1 by, for example, plating or any other suitable operations.

Figure 5K:
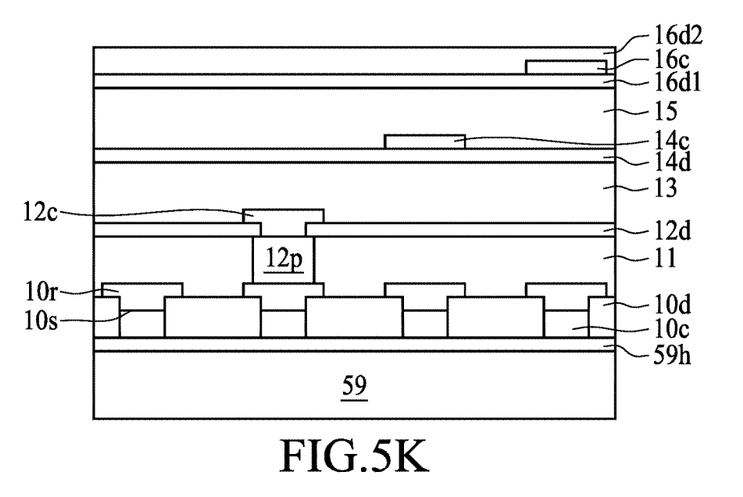

Referring to FIG. 5K, a dielectric layer 16d2 (e.g., a projection layer) is formed on the dielectric layer 16d1. The dielectric layer 16d2 covers the conductive layer 16c to prevent the conductive layer 16c from oxidation.

Figure 5L:
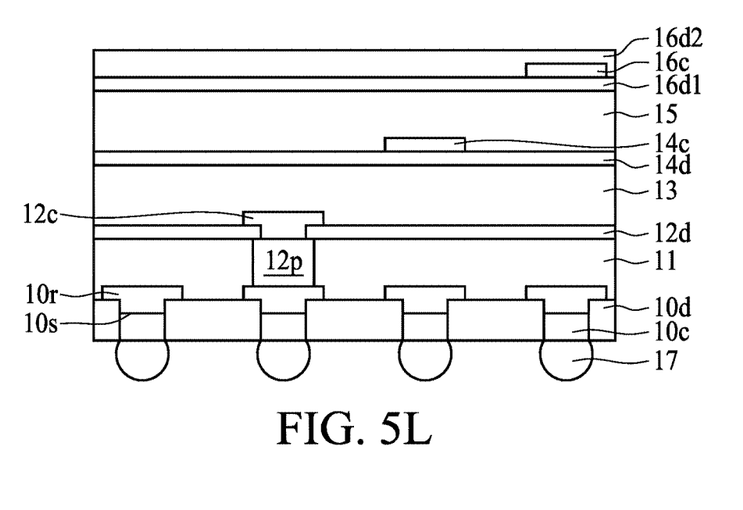

Referring to FIG. 5L, the carrier 59 is removed. The adhesive layer 59h is then removed to expose the conductive layer 10c and the dielectric layer 10d. In some embodiments, the adhesive layer 59 may be removed by, for example, etching or any other suitable operations. Electrical contacts 17 are then formed on the exposed portion of the conductive layer 10c.

In some embodiments, to enhance the performance of an antenna module, the conductive structure 12p may be required to have a relatively greater height. However, due to the process limitation (e.g., plating), it is difficult to form the conductive structure 12p having sufficient height to meet the requirement in a single plating operation. Hence, the operations as illustrated in FIG. 5C, FIG. 5D and FIG. 5E may be repeatedly carried out twice or more to form the conductive structure 22p (including the portions 22p1 and 22p2) with sufficient height as shown in FIG. 2. For example, the operations as illustrated in FIG. 5C, FIG. 5D and FIG. 5E can be carried out to form the portion 22p1, and then the same or similar operations can be carried out to form the portion 22p2. Hence, it is easier and more flexible to design the conductive structure 22p with the sufficient height to meet the requirements for designing an antenna module.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a substrate having an upper surface;
a reflector disposed above the upper surface of the substrate;
a radiator disposed above the reflector; and
a first director disposed above the radiator,
wherein the reflector, the radiator, and the first director collectively define an antenna, the reflector, the radiator, and the first director are free from overlapping each other vertically from a cross-sectional view perspective, and a radiation direction of the antenna is non-parallel to the upper surface of the substrate.

2. A semiconductor device, comprising:
a substrate having a top surface;
a first antenna disposed over the top surface of the substrate and comprising a reflector;
a second antenna disposed over the top surface of the substrate and comprising a first director; and
a dielectric layer disposed over the top surface of the substrate,
wherein an angle between a normal line of the top surface of the substrate and a radiation direction of the first antenna is different from an angle between the normal line of the top surface of the substrate and a radiation direction of the second antenna; and
wherein the reflector of the first antenna and the first director of the second antenna are within the dielectric layer.

3. The semiconductor device of claim 1, wherein a projection of an entirety of the radiator on the upper surface of the substrate is spaced apart from a projection of the first director on the upper surface of the substrate.

4. The semiconductor device of claim 3, wherein the projection of the entirety of the radiator on the upper surface of the substrate is spaced apart from a projection of the reflector on the upper surface of the substrate.

5. The semiconductor device of claim 1, wherein a projection of an entirety of the radiator on the upper surface of the substrate is between and spaced apart from a projection of the first director on the upper surface of the substrate and a projection of the reflector on the upper surface of the substrate.

6. The semiconductor device of claim 1, further comprising a second director above the first director, wherein the reflector, the radiator, the first director, and the second director collectively define the antenna.

7. The semiconductor device of claim 6, wherein the reflector, the radiator, the first director, and the second director are free from overlapping each other vertically from a cross-sectional view perspective.

8. The semiconductor device of claim 7, wherein a projection of the first director on the upper surface of the substrate is between a projection of the second director on the upper surface of the substrate and a projection of the radiator on the upper surface of the substrate.

9. The semiconductor device of claim 1, further comprising a conductive pillar directly contacting the radiator and the substrate.

10. The semiconductor device of claim 9, wherein a bottom surface of the conductive pillar is substantially level with a top surface of the reflector.

11. The semiconductor device of claim 9, wherein the first director, the reflector and the conductive pillar are free from overlapping each other vertically from a cross-sectional view perspective.

12. The semiconductor device of claim 1, wherein a difference between a thickness of the radiator and a thickness of the reflector is less than a difference between the thickness of the radiator and a thickness of the first director.

13. The semiconductor device of claim 1, further comprising a dielectric layer and a molding compound over the dielectric layer, wherein the radiator comprises a first portion within the molding compound and a second portion within the dielectric layer.

14. The semiconductor device of claim 13, further comprising a conductive pillar directly contacting the second portion of the radiator, wherein two lateral surfaces of the second portion of the radiator are recessed with respect to two lateral surfaces of the conductive pillar and two lateral surfaces of the first portion of the radiator.

15. The semiconductor device of claim 14, wherein the reflector comprises a bottom portion and a top portion connected to the bottom portion, and two lateral surfaces of the bottom portion are recessed with respect to two lateral surfaces of the top portion.

16. The semiconductor device of claim 2, wherein the first antenna further comprises a radiator and a director, and the reflector of the first antenna, the radiator of the first antenna, and the director of the first antenna are within the dielectric layer and all at a substantially same elevation with respect to the substrate.

17. The semiconductor device of claim 16, wherein the second antenna further comprises a second director, and an elevation of the second director is higher than the elevation of the reflector of the first antenna, the radiator of the first antenna, and the director of the first antenna with respect to the substrate.

18. The semiconductor device of claim 2, wherein a top surface of the first director of the second antenna and a top surface of the reflector of the first antenna are at a substantially same elevation with respect to the substrate.

19. The semiconductor device of claim 2, wherein an angle between the radiation direction of the first antenna and the radiation direction of the second antenna is greater than 90°.

20. The semiconductor device of claim 2, wherein the second antenna comprises a reflector, and a thickness of the reflector of the first antenna is less than a thickness of the reflector of the second antenna.

* * * * *